United States Patent [19]
Kledzik

[11] Patent Number: 5,400,003
[45] Date of Patent: * Mar. 21, 1995

[54] INHERENTLY IMPEDANCE MATCHED INTEGRATED CIRCUIT MODULE

[75] Inventor: Kenneth J. Kledzik, Boise, Id.

[73] Assignee: Micron Technology, Inc., Boise, Id.

[*] Notice: The portion of the term of this patent subsequent to Nov. 30, 2010 has been disclaimed.

[21] Appl. No.: 105,275

[22] Filed: Aug. 12, 1993

Related U.S. Application Data

[63] Continuation of Ser. No. 932,108, Aug. 19, 1992, Pat. No. 5,266,912.

[51] Int. Cl.⁶ .......................................... H03H 11/00
[52] U.S. Cl. ..................................... 333/247; 333/33
[58] Field of Search .............. 333/33, 246, 247, 260; 257/664, 685, 686, 700, 723, 724, 728, 777, 778; 439/63, 65, 581, 651, 655; 174/255, 260, 267; 361/735, 785

[56] References Cited

U.S. PATENT DOCUMENTS

| | | | |
|---|---|---|---|
| 4,149,764 | 4/1979 | Mattingly, Jr. | 439/651 X |
| 4,398,235 | 8/1983 | Lutz et al. | 257/686 X |
| 4,577,214 | 3/1986 | Schaper | 257/691 |
| 4,724,409 | 2/1988 | Lehman | 333/260 |
| 4,807,019 | 2/1989 | Tustaniwskyj | 257/685 |
| 4,906,957 | 3/1990 | Wilson | 333/260 X |
| 4,953,060 | 8/1990 | Lauffer et al. | 361/710 |
| 5,136,271 | 8/1992 | Nishioka et al. | 333/247 X |
| 5,199,879 | 4/1993 | Kohn et al. | 439/63 |
| 5,264,729 | 11/1993 | Rostoker et al. | 257/700 X |
| 5,266,912 | 11/1993 | Kledzik | 333/247 |

*Primary Examiner*—Paul Gensler
*Attorney, Agent, or Firm*—Susan B. Collier

[57] ABSTRACT

A semiconductor circuit module is formed with external connections on coaxial pins. This provides a controlled impedance between a ground connection and a signal connection which is substantially equal per unit length. The module may be configured so that the impedance of the connection between the signal connections and integrated circuit may also be optimally impedance matched.

19 Claims, 6 Drawing Sheets

INHERENTLY IMPEDANCE MATCHED INTEGRATED CIRCUIT MODULE

CROSS-REFERENCE TO RELATED APPLICATIONS

This is a continuation to U.S. patent application Ser. No. 07/932,108, filed Aug. 19, 1992, now U.S. Pat. No. 5,266,912, issued Nov. 30, 1993.

FIELD OF INVENTION

The invention is directed to impedance control in the connection of integrated circuits and to the interconnection of such circuits. This invention further relates to printed conductor techniques and semiconductor die techniques, specifically as relates to interconnection of multiple semiconductor packages to form modularly stacked multichip modules (SMCMs).

BACKGROUND OF THE INVENTION

Integrated semiconductor devices are typically constructed en masse on a wafer of silicon or gallium arsenide. Each device generally takes the form of an integrated circuit (IC) die, which is attached to a leadframe with gold wires. The die and leadframe are then encapsulated in a plastic or ceramic package, which is then recognizable as an IC (integrated circuit). ICs come in a variety of forms such as dynamic random access memory (DRAM) ICs, static random access memory (SRAM) ICs, read only memory (ROM) ICs, gate arrays, and so forth. The ICs are interconnected in myriad combinations on printed circuit boards by a number of techniques, such as socketing and soldering.

Interconnections among ICs arrayed on printed circuit boards are typically made by conductive traces formed by photolithography and etching processes.

Such semiconductor devices typically take the form of a semiconductor die. The die is generally electrically attached to a leadframe within a package. The leadframe physically supports the die and provides electrical connections between the die and outside world. The die is generally electrically attached to the leadframe by means of fine gold wires. These fine gold wires function to connect the die to the leadframe, so that the gold wires are electrically in series with the leadframe leads. The leadframe and die is then encapsulated, in the form of the familiar integrated circuit. The packaged chip is then able to be installed on a circuit board by any number of techniques, such as socketing and soldering.

The SIMM is a highly space-efficient memory board having no on-board address circuity and which some types of circuit arrays, such as SIMMs (single in line memory module), are designed to plug busses of a computer so that the randomly-addressable memory cells of the SIMM can be addressed directly by the computer's CPU rather than by a bank-switching technique commonly used in larger memory expansion boards. Memory cells on the SIMM are perceived by the computer's CPU as being no different than memory cells found on the computer's mother board. Since SIMMs are typically populated with byte multiple of DRAMs, for any eight bit byte of sixteen bit byte or word of information stored within a SIMM, each of the component bits will be found on a separate chip and will be individually addressable by column and row. One edge of a SIMM module is a card-edge connector, which plugs into a socket on the computer which is directly connected to the computer busses required for powering and addressing the memory on the SIMM.

These modules have been constructed by first packaging individual dice (IC chips) into packages, and then soldering the packaged chips onto a printed circuit board. The chips had been attached by surface mount techniques (e.g. PLCC chips) or into through holes (e.g. DIP packaged chips). While this facilitates discrete testing prior to module assembly, no advantage is taken of the module (SIMM) level assembly in connecting the dice to their leadframes.

Other circuits which are constructed from standard components have in the past used discretely encapsulated integrated circuits (Ics) which are then fixed to a printed circuit board. Large scale integrated (LSI) circuits had been used to reduce or eliminate multiplicity of encapsulation operations, but LSI techniques require that each mask step required for each part of the circuit be performed on a wafer used to form the entire circuit.

On circuits with low yields, it is often desirable to fabricate the circuit in segments, and then assemble the completed segments at a board level. Thus, DRAMs are fabricated in excess of 100 dice per wafer, and the dice are separated, even though the computer may have a high number of DRAMs installed as RAM memory. This is done because individual chips will vary in performance across a wafer and because yield tends to diminish as attempts are made to expand memory size. By individually packaging chips and then assembling arrays of chips at a board level, parts may be segregated according to performance and the use of failed parts may be avoided.

When increasing the circuitry on a single integrated circuit, care must be taken to ascertain that the processes which are used to fabricate each circuit element are compatible. Even in cases where, for example, state of the art DRAM technology is used in design of logic chips, the optimum process parameters for different types of circuits will vary. As an example, it is difficult to provide a single chip with both a microprocessor and a memory array.

Thus, a VLSI chip has the advantage of packaging a large number of circuits onto a single leadframe, but requires that a variety of circuits share the same process steps. It would be desirable to provide multiple circuits which are grouped after fabrication into a single integrated circuit package. It would also be desirable to provide circuits which are manufactured under different process steps as a single integrated circuit package.

Interconnects consist of unsupported sections of Cu traces on a plurality of planes. The circuits on each plane are positioned so that the appropriate Cu traces are aligned over and under each other. The unsupported traces will meet each other between the upper and lower planes. All Cu to Cu interconnects can be formed simultaneously. The spacing between the circuit planes will be optimized for thermal, mechanical, and electrical properties. It is anticipated that the smaller geometries common with TAB circuitry will provide a significant improvement in electrical properties so that the conventional power and ground plane layers can be eliminated.

The polymer/Cu circuit now "loaded" with ICs is electrically functional and ready for functional testing, but still lacks physical package support.

In alternate embodiments, a TAB circuit with ICs mounted to the TAB circuit is encapsulated on one or both sides, with external terminations exposed for subsequent connections.

The techniques used for assembling arrays of similar circuits are also applicable for forming circuit modules of unlike circuits. In such an arrangement, the individual dice are mounted to the TAB printed wire assembly (PWA) and the dice are encapsulated subsequent to the dice being mounted. While this technique can be used for most board level products, it is particularly suitable for products in which it would be uneconomical to replace components on the board instead of replacing the entire board. External connections are provided either as a part of the encapsulated TAB PWA, or by attaching an appropriate connector to the PWA.

This enables an encapsulated assembly to be formed in circumstances where an LSI circuit would be ideal for assembly purposes, but the yields of manufacturing LSI circuits would result in undue expense.

It is proposed that multiple integrated circuit devices be packaged as a single unit, known as a multi chip module (MCM). This can be accomplished with or without conventional lead frames. This creates two problems compared to conventional test methods. Firstly, discrete testing is more difficult because the conventional lead frame package is not used. Furthermore, when multiple devices are assembled into a single package, the performance of the package is reduced to that of the die with the lowest performance. In other words, the ability to presort the individual dice is limited to that obtained through probe testing. Secondly, the packaging may have other limitations which are aggravated by burn-in stress conditions so that the packaging becomes a limitation for burn-in testing.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL.\ KGD}$$

Note that in the case of discretely packaged parts, the cost of the die ($C_{DIE}$) is essentially not a factor. This changes in the case of MCMs:

$$(C_{DIE}) \times \frac{(number\ of\ die)}{Yield} \times C_{PACKAGE} = C_{DIE} \times C_{ADDL.\ KGD}$$

Note that again $C_{DIE}$ is not a factor in modules having identical part types; however, the equation must be modified to account for varied costs and yields of die in modules with mixed part types. With MCMs, the cost of packaging a failed part is proportional to the number of die in the module. In the case of a x16 memory array module, where probe-to-ship yield of the die is 95%, the costs are:

$$\frac{16}{0.95} \times C_{PACKAGE} = C_{ADDL.\ KGD}$$

so the additional costs of testing for known good die (KGD) may be 16 times the cost of testing after assembly of an unrepairable module in order to be economical. This, of course, is modified by the ability to repair failed modules.

More complex systems, involving more semiconductor die, present more opportunity for failure. Therefore, it is advantageous that modules be configured so the module be able to be tested in component parts which may be assembled after testing.

Conventional computer systems, whether general purpose, desktop, work stations, or imbedded controllers (e.g., small computers used to control tools, instruments, or appliances), all include some form of read/write memory. At the present time, the most popular form of read/write memory is the semiconductor DRAM (or Dynamic Random Access Memory).

The maximum operating speed of a computer device depends on two things: how fast the processor can execute instructions, and how long it has to wait for instructions or data. As speeds increase, the capability of connecting circuity becomes a limiting factor. Thus, a microprocessor may operate at speeds which exceed the capabilities of the circuit board to which the microprocessor is intended to be mounted.

One solution to the problem of speed limitations of circuit boards is a "speed doubler" or "speed multiplier" circuit. The speed multiplier circuit permits a circuit to operate at a higher clock speed than its associated system components. In one example, a microprocessor is operated with a speed multiplier, while a motherboard to which the microprocessor is mounted operates at a lower clock speed. In such speed multiplier circuits, the high speed operations are limited to the component with the speed multiplier. Operations which are external to that component remain speed limited.

Multichip modules have the advantage that they avoid some of the speed limitations of the circuit board (motherboard). MCMs also have the disadvantage of requiring that a large number of semiconductor die be tested and matched prior to assembly. It would be advantageous if multiple MCMs could be assembled without signals being required to pass through a separate circuit board. This would in effect result in the assembly of a larger MCM.

Often it is desired to increase the capabilities and performance of a computer by adding components. If such components are to be made a part of a multichip module, the change would require a reconfiguration of the module. It would be desirable to permit a computer or other electronic device to be constructed with a multichip module architecture, but still permit reconfiguration of the architecture after the electronic device is assembled.

Integrated circuit technology provides performance capabilities beyond conventional PCB board and packaging technologies. Multichip modules represent a solution to allow integrated circuit performance to be fully realized at the module level. MCM development is severely limited by the high costs associated with design and simulation, component yield, and rework.

SUMMARY OF THE INVENTION

According to the invention, a multichip module (MCM) is formed with external connectors which are impedance controlled, thereby facilitating connection of a series of such multichip modules in a matched impedance configuration. The series then may be connected to a board or other circuit device.

Signal connections are coaxial in the sense that impedance between a ground connection and a signal connection are substantially equal per unit length. The module may be configured so that the impedance of the connection between the signal connections and integrated circuit may also be optimally impedance matched. This results in the ability to assemble a modularly stacked multichip module (SMCM) as a second level multichip module, formed from the series of multichip modules.

In a further aspect of the invention, a video display controller is provided, by which a plurality of modules may be stacked for providing video input information or as memory for the video information. The data may then be output in the form of a bit map.

DETAILED DESCRIPTION OF THE PREFERRED EMBODIMENTS

Figure 1:
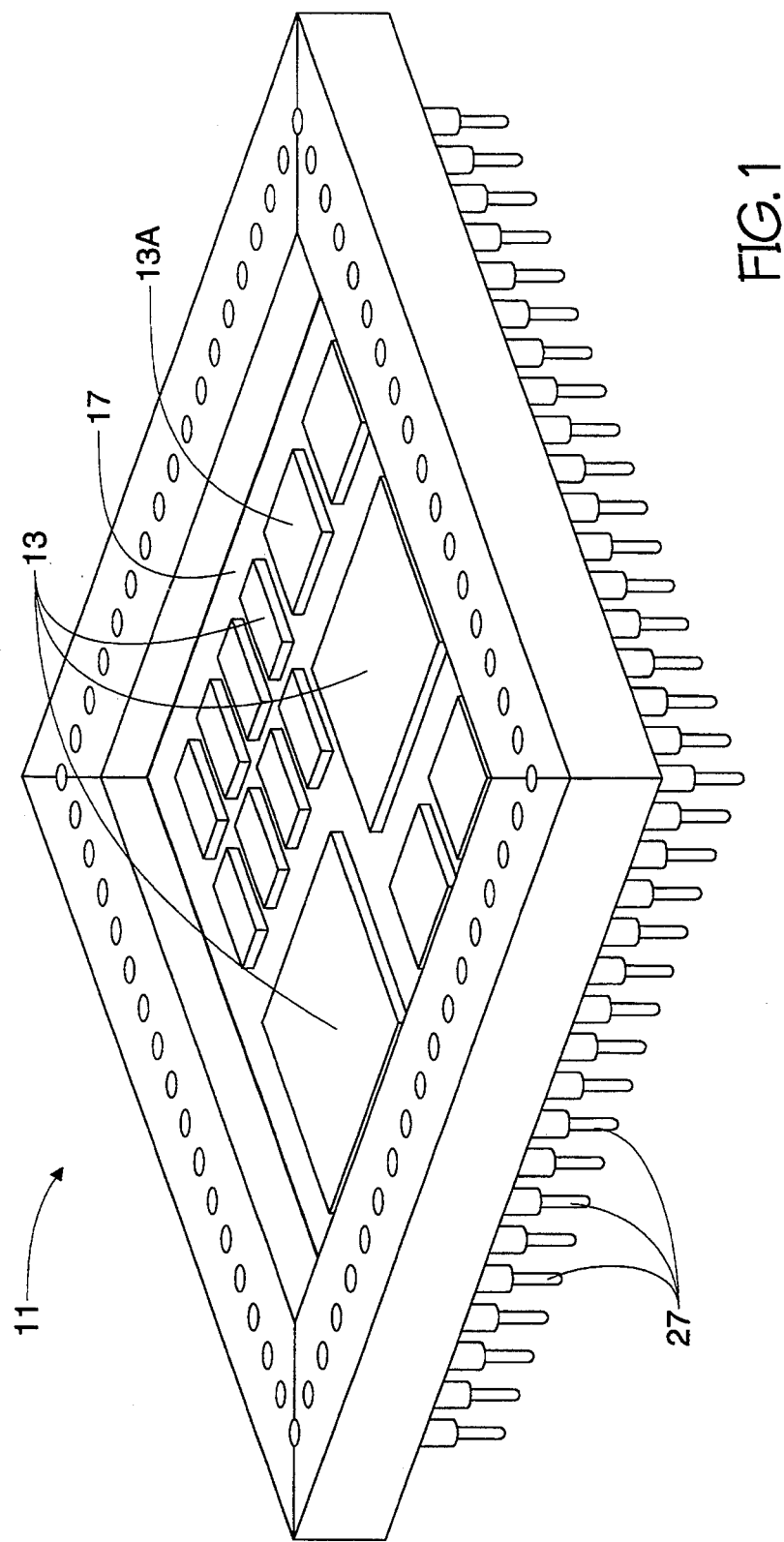
FIG. 1 shows a multichip module.

FIG. 1 shows a multichip module (MCM) 11 in which a plurality of semiconductor integrated circuits (ICs) 13 are mounted onto a substrate 17. The substrate 17 may consist only of circuit traces 19 on an insulator 21 (FIG. 2) or may itself include active circuitry. In either case, the substrate 17 connects the die 13 to a plurality of connection points, which are, in turn, connected to connection terminals 27. One of the ICs 13a may be a video address circuit, which receives signals through the connection terminals 27.

Figure 2:
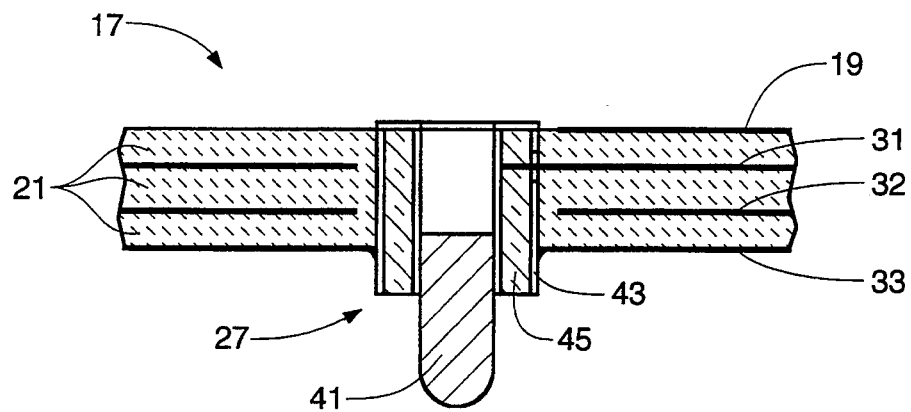
FIG. 2 shows a cross-section of a substrate of a multichip module, showing details of an interconnection terminal.

Referring to FIG. 2, details of the substrate 17 and a connection terminal 27 are shown. The substrate 17 consists of the insulator 21, onto which the circuit traces 19 are plated or otherwise deposited. In some cases, additional layers of circuit traces 31, 32, and 33 may be incorporated into or below the substrate 17, in the configuration of a multilevel printed circuit board. In many cases, one layer, such as layer 33, is configured as a ground plane. In this manner, the module 11 can be constructed with a controlled electrical impedance, as determined by various factors. Factors affecting impedance include the dielectric constant of the insulator 21, the amount of insulator between the ground plane layer 33 and the circuit traces in layers 19, 31, 32 which are not ground planes, and the dimensions of the circuit traces in the various layers 19, 31, 32 and 33.

Impedance matching is commonly used for signal transfer applications, in which the impedance between signal carrying conductors is a predetermined value per unit length, expressed in $\Omega/M$. Changes in length will result in proportional (inverse) change in impedance, but not change the impedance expressed in $\Omega/M$. The consistent impedance per unit length, colloquially referred to as, "impedance value," results in signal matching. This is of particular interest as operating frequencies exceed those at which unmatched circuits are effective. The use of impedance matched conductors in the present invention therefore facilitates the construction of circuits which are inherently impedance matched.

Matched impedance is thereby able to reduce spurious signals between devices, reduce circuit discontinuities, and allow connection circuitry to be designed while controlling the establishment of critical timing paths between components.

The connection terminals 27 include a connection pin 41 which is connected to one of the circuit traces 19. In the preferred embodiment, circuitry in intermediate layers 31, 32 is connected to the top layer 19 through vias (not shown) in order to permit all connections of the connection pins 41 to be effected through the top layer 19. The terminals 27 also include a shield 43, which is separated from the pin 41 by an isolation spacer 45. The spacer 45 is preferably a dielectric, but may be any material, such as resistor, provided that the spacer 45 permits impedance matched connections through the connection terminals 27.

In the preferred configuration, the connection terminals 27 are coaxial pin connectors, in which a center conductor is surrounded by a shield conductor which is coaxial with the center conductor. The shield conductor is typically connected to ground potential, which is found at the ground plane layer 33. The center conductor would be connected to one of the circuit traces in one of the other layers 19, 31 and 32.

The connection between die 13 and connection terminals 27 are preferably controlled impedance lines; i.e., stripline or microstrip type of implementation, or possibly no impedance control on a short connection. There are also likely to be lines which do not require impedance control, because linenoise on those lines would not cause irregular circuit operation. The die bonding wires would tee into the controlled impedance lines.

The structure of the connection terminals 27 would be typical to that of rigid or semi-rigid micro coax, i.e., a center conductor surrounded by a dielectric material with an outer shield, that allows teeing into the center conductor without discontinuity.

Figure 3:
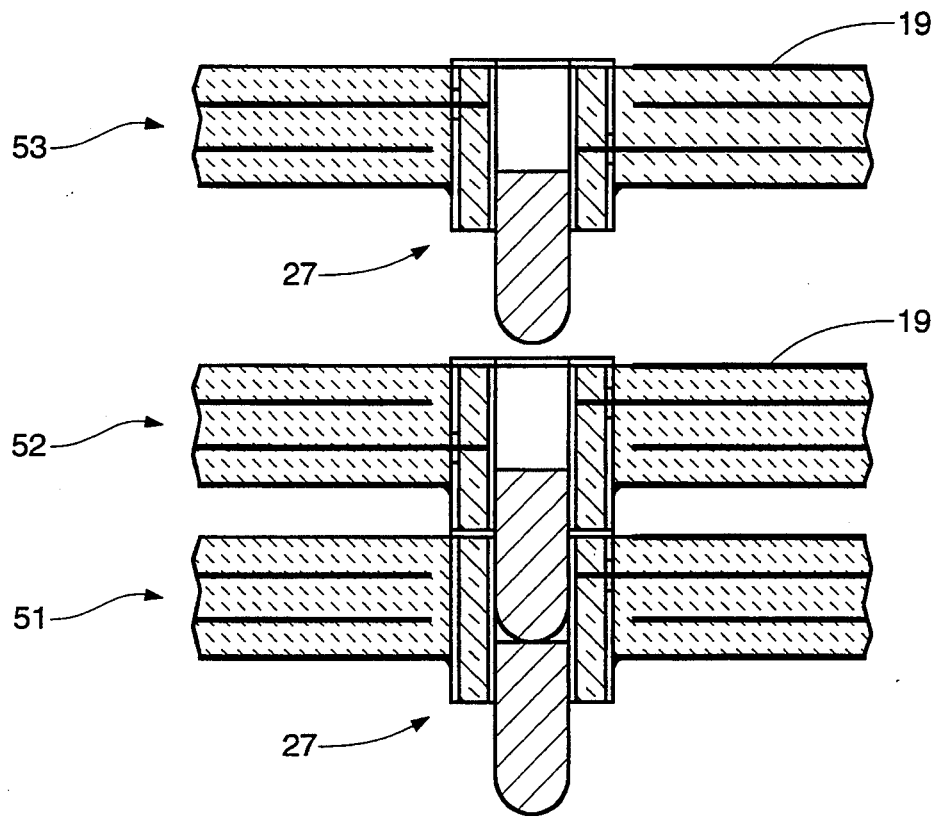
FIG. 3 shows details of the interconnection of a stack of modules.
Figure 4:
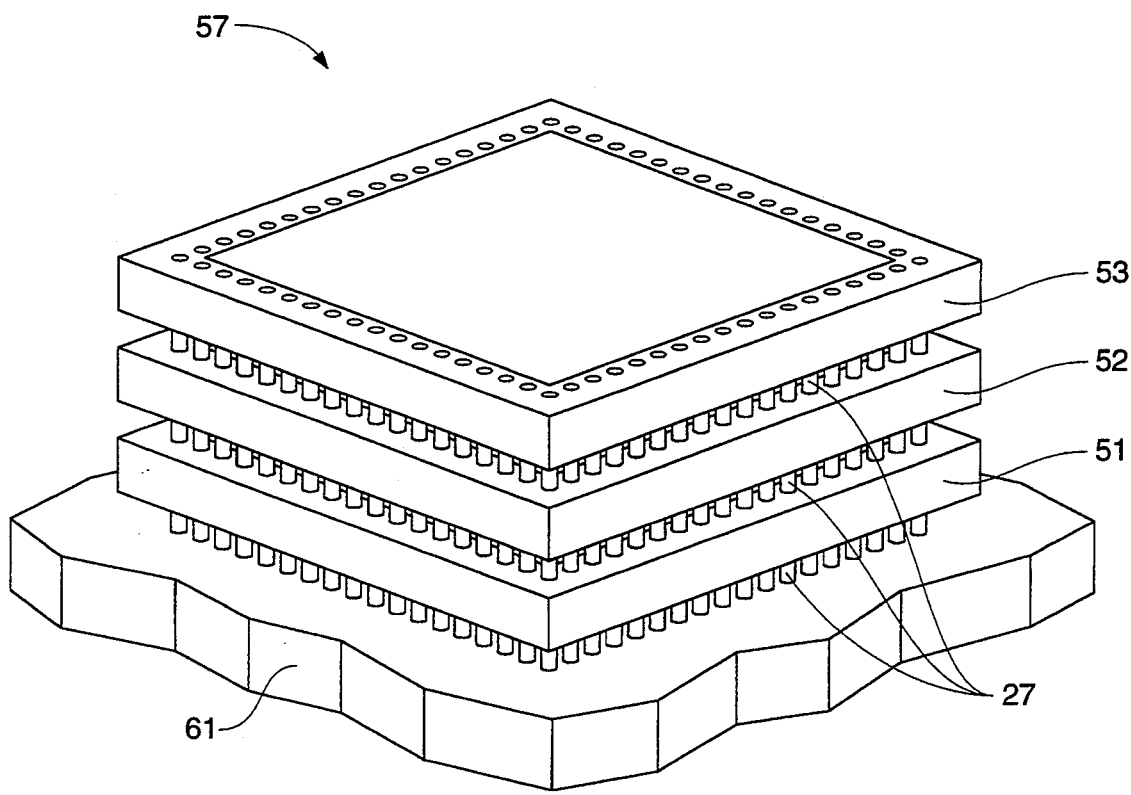
FIG. 4 shows a plurality of multichip modules stacked in order to form a modularly stacked multichip module.

Referring to FIG. 3, the connection terminals 27 permit the stacked connection of MCMs such as MCMs 51–53 shown. MCM 51 is positioned as a bottom module and MCM 52 is secured to MCM 51 so that their respective connection terminals 27 are interconnected. MCM 53 is shown as spaced apart from MCM 52. This arrangement of MCM 53 as being separate from MCM 52 would not actually occur except during the assembly of the MCMs, but shows the relationship of the connection terminals 27 on the superjacent MCMs. The connection of the MCMs 51–53 creates a modularly stacked multichip module, or SMCM 57, as shown in FIG. 4.

Figure 5:
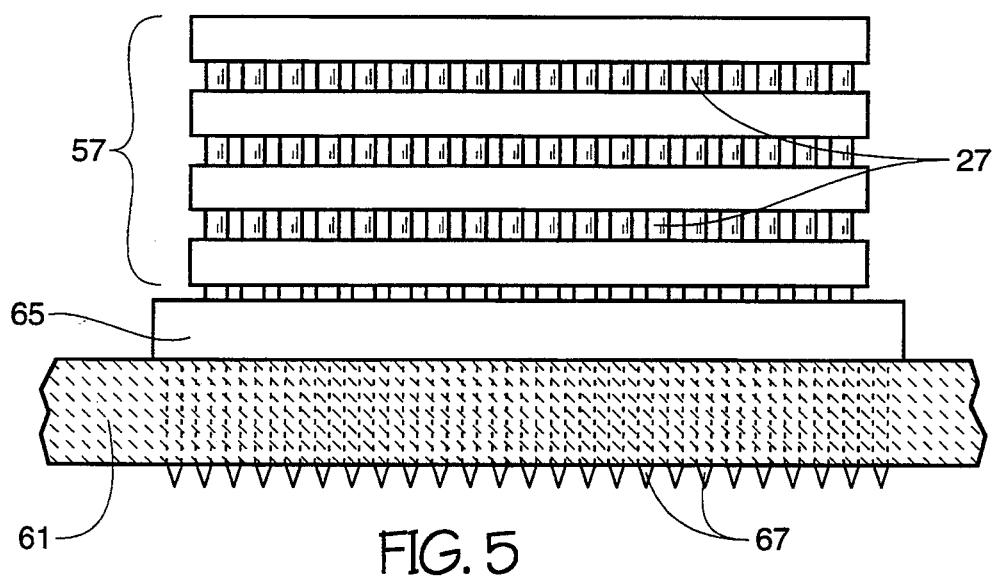
FIG. 5 shows a stacked multichip module mounted to a socket.

MCM 51 is in turn mounted to a PC board 61 in order to connect the SMCM 57 (of which MCM 51 is a part) to the board 61. The PC board 61 may be a conventional PC board such as a polyimide or epoxy board with circuit traces, or it may be any substrate which permits a connection of a circuit element such as module 57 thereon. As an example, a socket 65 may be used to mount the SMCM 57, as shown in FIG. 5. The board 61 has a plurality of module receiving terminals 67, which mate with the connection terminals 27 on the SMCM 57. The module receiving terminals 67 are preferably also impedance matched to the connection terminals 27.

The connection terminals 27 are sized so as to space each module 51-52 from each other, while establishing a compact size. This permits cooling, while the stacked arrangement reduces the space consumed by the modules 51-53. This space savings is achieved in part because of the vertical arrangement of the components, and in part because connection terminals 27 on multiple MCMs share the same areas on a motherboard, socket or other support.

Figure 6:
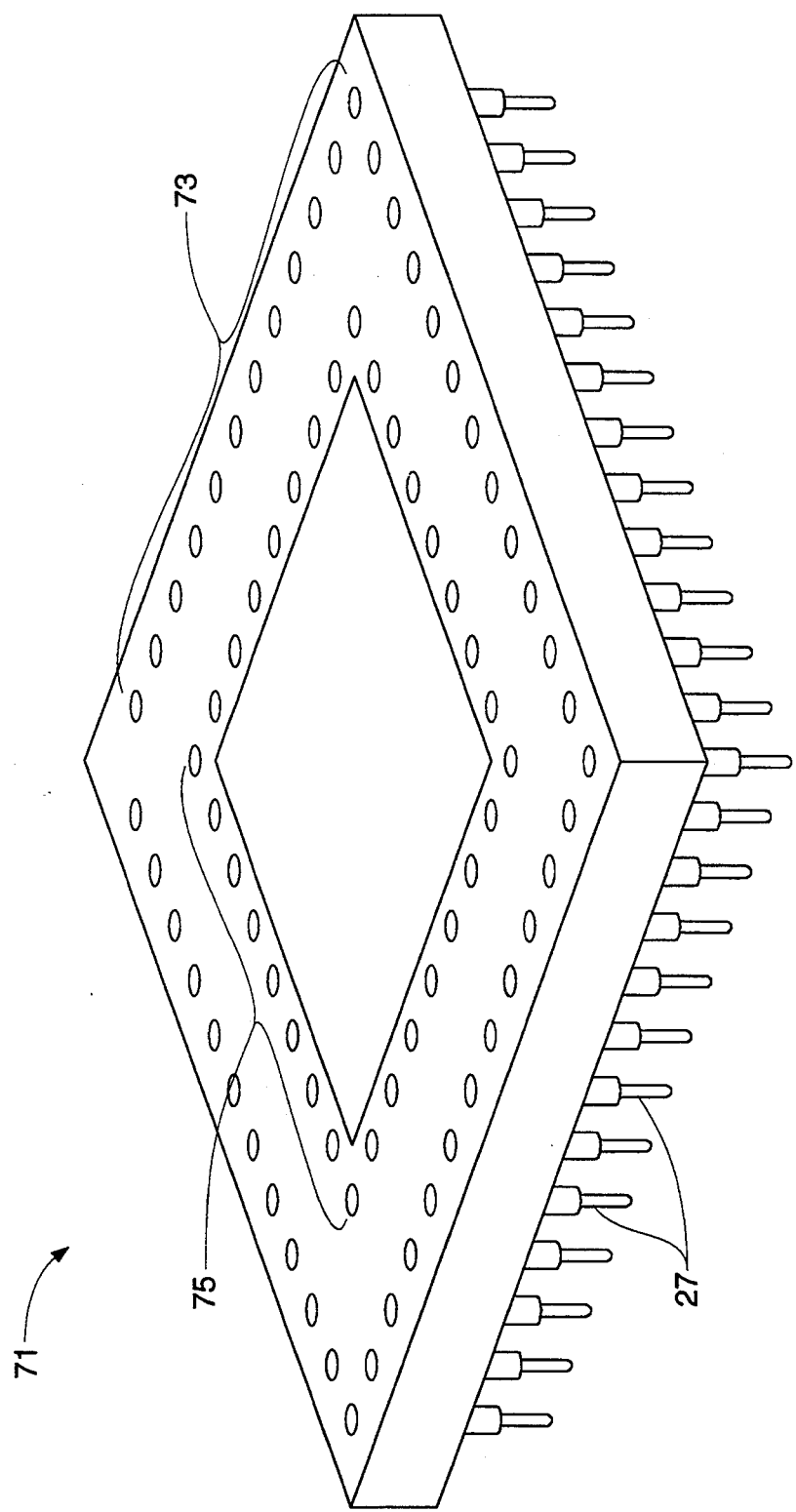
FIG. 6 shows a modification of the multichip modules shown in FIGS. 1 and 5, in which plural rows of connection terminals are provided.

FIG. 6 shows a multichip module 71 in which an outer perimetric set 73 of connection terminals 27 are supplemented by an additional group 75 of connection terminals 27. This arrangement permits a more dense arrangement of connectors, while also permitting more flexibility in the assignment of functions to the connectors 27. For example, some of the connectors may be required for communicating exclusively between different MCMs within a SMCM, whereas other connectors may be connections to external circuitry, such as an external power supply.

Figure 7:
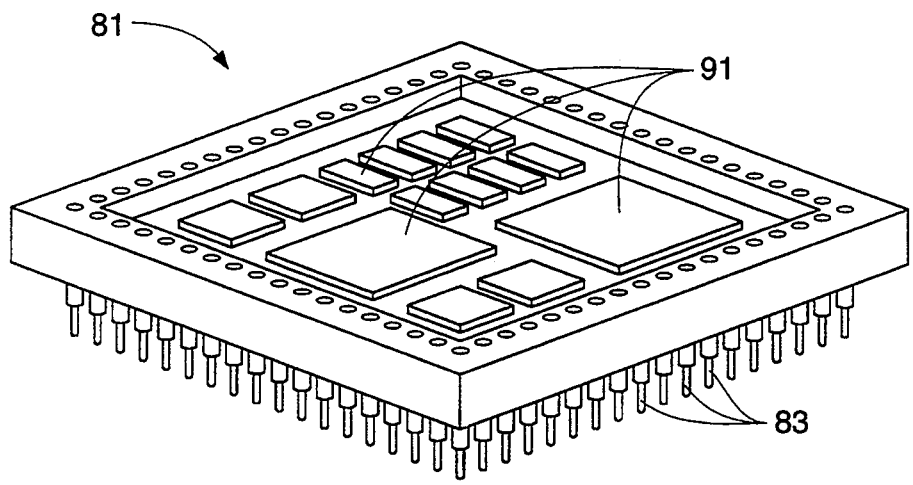
FIG. 7 shows a top module which may be used in a modularly stacked multichip module.

FIG. 7 shows a top module 81, which is used as a terminal end for the connectors 27 on modules 51-53. The top module 81 includes a plurality of terminating connectors 83, which mate with connectors 27. The terminating connectors 83 may be provided with a resistor connecting shield conductors with the center conductors. Alternatively, separate terminating resistances may be provided to connect the conductors. The purpose of the terminating resistances is to avoid reflected signals which could result in ringing and other signal interference. The use of terminating resistances does not preclude the top module 81 from having active circuitry, such as circuits 91 shown.

Figure 8:
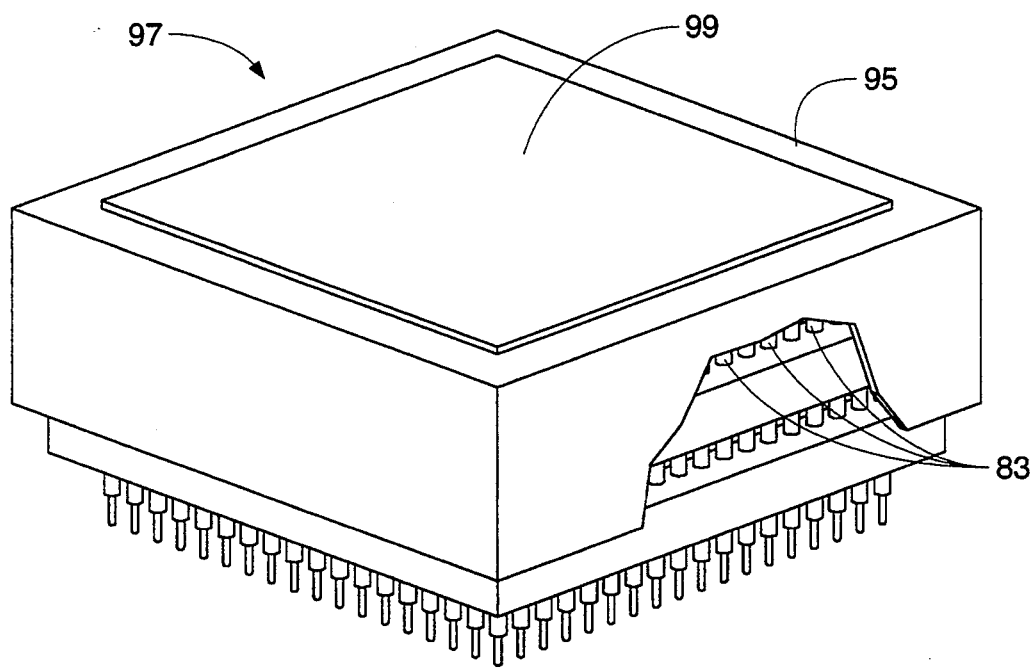
FIG. 8 shows the use of a top module which also functions as a cover for a modularly stacked multichip module.

FIG. 8 shows the use of a top module 95 which also functions as a cover for a SMCM 97. This configuration for a top module 95 permits the use of terminating resistors at the connectors 83, or separate terminating resistors on a substrate portion 99 of the top module 95. It is also possible to include active circuitry in the top module 95.

I claim:

1. An electronic component comprising:
a) a substrate having top and bottom sides and having circuit traces thereon;
b) active circuitry installed on the substrate and connected to the circuit traces; and
c) a plurality of connectors connected to the circuit traces;
the connectors each consisting of a primary conductor and a secondary conductor, wherein an impedance between the primary conductor and the secondary conductor per unit length is a predetermined value;
and whereby said component may be interconnected by said connectors with a further one of said component, said component configured so as to mate with said further component through said connectors so as to form an interconnected stack of a plurality of said component, and said stack connectable through a bottom said component of said stack to external circuitry, and wherein said impedance between said primary conductor and said secondary conductor of each of said connectors is selected in order to match impedances of said active circuitry and said external circuitry.

2. The electronic component of claim 1, wherein:
a) said plurality of connectors each consists of a center conductor functioning as the primary conductor and a shield conductor functioning as a secondary conductor;
b) the shield conductor surrounds the primary conductor; and
c) impedance controlling material is provided between the primary and shield conductors.

3. The electronic component of claim 2, wherein:
a) the substrate has a ground plane thereon; and
b) said shield conductors are connected to said ground plane.

4. The electronic component of claim 2, wherein:
a) said impedance controlling material between the primary and shield conductors is a dielectric.

5. The electronic component of claim 2, wherein:
a) said impedance controlling material between the primary and shield conductors is a dielectric; and
b) said primary and shield conductors are coaxially arranged.

6. The electronic component of claim 2, wherein:
said primary and shield conductors are coaxially arranged.

7. The electronic component of claim 1, wherein:
a) said circuitry includes a ground plane; and
b) said ground plane is connected to said secondary conductors.

8. The electronic component of claim 1, wherein:
the plurality of connectors is arranged in at least two rows.

9. A multichip module comprising:
a) a plurality of interconnected components, each component of said plurality comprising:
a substrate with active circuitry thereon, and the substrate having circuit traces thereon;
the substrate having top and bottom sides;
the active circuitry connected to the circuit traces;
the substrate having a plurality of connectors connected to the circuit traces, the connectors each consisting of a primary conductor and a secondary conductor, wherein an impedance between the primary conductor and the secondary conductor per unit length is a predetermined value; and wherein
b) the connectors of one of said components of said plurality are connectable to connectors of a further one of said components of said plurality which, in turn, may be interconnected with additional said components of said plurality to form the multi-chip module, a bottom said component of said multichip module connectable to external circuitry, wherein said impedance between said primary conductor and said secondary conductor of each of said connectors is selected in order to match impedances of said active circuitry and said external circuitry.

10. The multichip module of claim 9, wherein:

a) said plurality of connectors each consists of a center conductor functioning as the primary conductor and a shield conductor functioning as a secondary conductor;
b) the shield conductor surrounds the primary conductor; and
c) impedance controlling material is provided between the primary and shield conductors.

11. The multichip module of claim 10, wherein:
a) the substrate has a ground plane thereon; and
b) said shield conductors are connected to said ground plane.

12. The multichip module of claim 10, wherein:
a) said impedance controlling material between the primary and shield conductors is a dielectric.

13. The multichip module of claim 10, wherein:
a) said impedance controlling material between the primary and shield conductors is a dielectric; and
b) said primary and shield conductors are coaxially arranged.

14. The multichip module of claim 9, wherein:
a) said circuitry includes a ground plane; and
b) said ground plane is connected to said secondary conductors.

15. The multichip module of claim 9, wherein:
the plurality of connectors is arranged in at least two rows.

16. A module for video signal processing, the module comprising:
a) a plurality of components, each component of said plurality comprising:
a substrate with active circuitry thereon, the substrate having circuit traces thereon;
the substrate having top and bottom sides;
the active circuitry connected to the circuit traces;
the substrate having a plurality of connectors connected to the circuit traces, the connectors each consisting of a primary conductor and a secondary conductor, wherein an impedance between the primary conductor and the secondary conductor per unit length is a predetermined value;
the connectors of one of said components of said plurality being connectable to connectors of a further one of said components of said plurality which, in turn, may be interconnected with additional said components of said plurality. a bottom said component connectable to external circuitry, and wherein said impedance between said primary conductor and said secondary conductor of each of said connectors is selected in order to match impedances of said active circuitry and said external circuitry; and
b) a video address circuit, the video address circuit receiving signals through at least a portion of the connectors and providing an output in the form of bit mapped signals.

17. The module of claim 16, wherein:
a) said connectors each consist of a center conductor functioning as the primary conductor and a shield conductor functioning as a secondary conductor;
b) the shield conductor surrounding the primary conductor; and
c) impedance controlling material between the primary and shield conductors.

18. The module of claim 17, wherein:
a) the substrate has a ground plane thereon; and
b) said shield conductors are connected to said ground plane.

19. The module of claim 16, wherein:
the plurality of connectors is arranged in at least two rows.

* * * * *